(12) United States Patent
Eguchi

(10) Patent No.: US 6,313,606 B1
(45) Date of Patent: Nov. 6, 2001

(54) METHOD AND APPARATUS FOR DETECTING BATTERY CAPACITY

(75) Inventor: Yasuhito Eguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/230,910

(22) PCT Filed: Jun. 3, 1998

(86) PCT No.: PCT/JP98/02459

§ 371 Date: Oct. 6, 1999

§ 102(e) Date: Oct. 6, 1999

(87) PCT Pub. No.: WO98/56059

PCT Pub. Date: Dec. 10, 1998

(30) Foreign Application Priority Data

Jun. 3, 1997 (JP) .................................................. 9-145121

(51) Int. Cl.[7] .............................. G02J 7/04; G01N 27/416
(52) U.S. Cl. .......................... 320/132; 320/134; 320/136; 320/149; 320/162; 324/427; 324/428; 324/433
(58) Field of Search ..................................... 320/132, 134, 320/136, 149, 162; 324/427, 428, 433

(56) References Cited

U.S. PATENT DOCUMENTS

| 5,140,251 | * | 8/1992 | Wu .................................... 320/132 |
| 5,596,260 | | 1/1997 | Moravec et al. . |

FOREIGN PATENT DOCUMENTS

| 5-134020 | 5/1993 | (JP) . |
| 8-163705 | 6/1996 | (JP) . |

* cited by examiner

Primary Examiner—Gregory J Toatley, Jr.
(74) Attorney, Agent, or Firm—Sonnenschein, Nath & Rosenthal

(57) ABSTRACT

A method and apparatus for detecting the capacity of a battery wherein a voltage method of measuring the voltage of the battery, to calculate the capacity of the battery based on the correlation between the voltage and the capacity of the battery, is switched to a current integrating method of integrating the current magnitude of the battery with respect to time, to calculate the capacity of the secondary battery, and vice versa, with a pre-set current magnitude as a threshold value, in order to detect the capacity of the battery. By selectively using the voltage method and the current integrating method depending on the current magnitude of the battery, the capacity of the battery can be calculated with greater accuracy.

28 Claims, 4 Drawing Sheets

METHOD AND APPARATUS FOR DETECTING BATTERY CAPACITY

BACKGROUND OF THE INVENTION

1. Field of the Invention

The present invention relates to a method for detecting the capacity of a battery loaded on a piece of electronic equipment, such as a portable personal computer, for furnishing the power. The present invention also relates to an associated battery pack and to an associated electronic equipment system.

2. Description of the Prior Art

In order to know the capacity (residual capacity) of a battery, such as a lithium ion battery, it is generally practiced to estimate the residual capacity from a terminal voltage of the battery or to integrate the efflux current to estimate the residual capacity.

As a method for detecting the capacity (residual capacity) of such battery, there are currently proposed a voltage method and a current integrating method. The voltage method measures the voltage of the battery to calculate the capacity of the battery based on the correlation between the voltage and the capacity of the battery. The current integrating method integrates the current of the battery with respect to time to calculate the capacity of the battery. In the voltage method, the capacity calculation accuracy is high when the current of the battery is small, conversely, in the current integrating method (coulomb method), the capacity calculation accuracy is high when the current of the battery is large. Since the voltage method is based on the voltage, there is no integrating error, but there is a direct error. Since the current integrating method integrates and updates the current with respect to a reference value, the integration error is significant, though the direct error is small.

The voltage method calculates the capacity from the correlation between the capacity and the terminal-to-terminal voltage of the battery (cell voltage). Since the battery (cell) has an internal resistance and a hence A the terminal voltage is fluctuated depending on the flowing current, correction is applied based on the current multiplied by the inner battery voltage. If the current is enlarged, the amount of correction becomes larger to increase the error.

The current integrating method integrates the current with respect to time to find the electrical quantity Ah. For improving the precision, current measurement accuracy needs to be raised. For this reason, an operational amplifier or an analog-to-digital (A/D) converter of extremely high precision is used. Nevertheless, there is produced significant error if charging/discharging is repeated over an extended time interval, or if the current is of a small magnitude, so that contrivances such as calibration are occasionally required such as at the time of charging the battery to its fill capacity. If the calibration timing is lost, significant errors are inevitably produced.

SUMMARY OF THE INVENTION

In view of the above-mentioned problems, an object of the present invention is to provide a battery capacity detection method, a battery pack and an electronic equipment system, in which the voltage method and the current integration method are selectively used depending on the magnitude of the current through the battery to raise the calculation accuracy of the capacity of the battery (residual capacity).

For solving the above problem, the present invention provides a method for detecting the capacity of a battery in which a voltage method of measuring the voltage of the battery to calculate the capacity of the battery, based on the correlation between the voltage and the capacity of the battery, is switched to a current integrating method of integrating the current magnitude of the battery with respect to time, to such is done calculate the capacity of the battery, and vice versa, with a pre-set current magnitude as a threshold value, in order to detect the capacity of the battery.

The present invention also provides a method for detecting the capacity of a battery in which a voltage method of measuring the voltage of the secondary battery, to calculate the capacity of the battery based on the correlation between the voltage and the capacity of the battery, is switched to a current integrating method of integrating the current magnitude of the battery with respect to time to calculate the capacity of the battery, and vice versa, with a pre-set magnitude of voltage drop as a threshold value, in order to detect the capacity of the battery.

With the capacity detection method according to the present invention, the capacity of a battery can be calculated with greater accuracy by switching between the voltage method and the current integrating method responsive to a pre-set current magnitude or to a pre-set magnitude of the voltage drop.

More specifically, the present invention provides a battery pack having the function of detecting the capacity of a battery, wherein the battery pack includes voltage detection means for detecting the voltage of the battery to calculate the capacity of the battery based on; correlation between the voltage and the capacity of the battery, current detection means for detecting the current magnitude of the battery to calculate the capacity of the battery by integrating the current magnitude of the battery with respect to time, and control means for switching between the operation of calculating the capacity of the battery based on the correlation between the voltage and the capacity of the battery responsive to a pre-set current magnitude and the operation of calculating the capacity of the battery by integrating the current magnitude of the battery with respect to time.

With the pack of the battery according to the present invention, the control means is responsive to the pre-set current magnitude or to the pre-set magnitude of the voltage drop to switch between the operation of calculating the capacity of the battery based on the correlation between the voltage and the capacity of the battery and the operation of calculating the capacity of the battery by integrating the current magnitude of the secondary battery with respect to time to improve the accuracy in capacity calculations.

The electronic equipment system of the present invention resides in the above-described battery pack loaded on a piece of electronic equipment, such as a personal computer, in which the calculation accuracy of the battery can be improved by switching between the voltage method and the current integrating method during the capacity calculations.

Additional features and advantages of the present invention are described in, and will be apparent from, the Detailed Description of the Preferred Embodiments and the Description of the Drawings.

BREIF DESCRIPTION OF THE DRAWINGS

DESCRIPTION OF THE PREFERRED EMBODIMENTS

Figure 1:
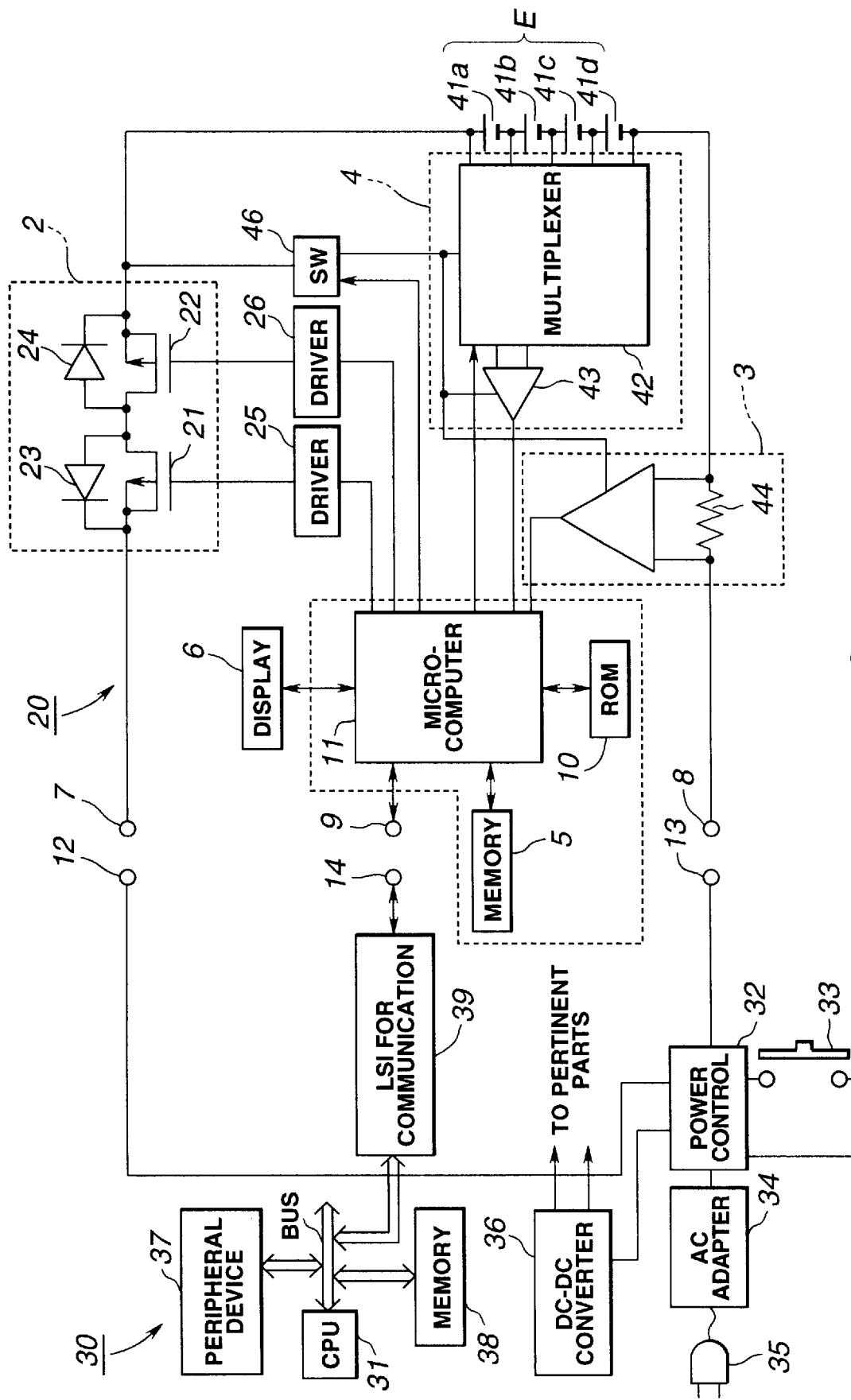
FIG. 1 shows an electronic equipment system including of a battery pack for realizing the battery capacity detection method or the present invention and a personal computer, given as an example of an associated piece of electronic equipment.

FIG. 1 shows a battery pack 20 (pack of a battery E) for carrying out the capacity detection method for a battery according to the present invention and a personal computer 30 as typical of a piece of electronic equipment on which is loaded the battery pack 20. This personal computer 30 is, for example, a portable personal computer, on which battery pack 20 can be loaded and which is actuated by the power fed from this battery pack 20.

To a bus line BUS of a main central processing unit (CPU) of the personal computer 30 are connected a variety of peripheral devices 37, a memory 38, such as a read-only memory (ROM) or a random-access memory (RAM), and a communication LSI 39, etc. A power control circuit 32 is provided with a power source switch 33 to perform power on/off control. In addition, commercial ac power from a power source plug 35 is fed to the power control circuit 32 via an ac adapter 34 to supply the power from the battery pack 20 via +terminal 12 and a –terminal 13 for battery connection as later explained. The charging current is fed via terminals 12, 13 to the battery pack 20.

Turning to FIG. 1 for explanation of the structure of the battery pack 20, the battery pack 20 includes a voltage detection circuit 4, a current detection circuit 3, and a controller 1. The controller 1 includes a micro-computer 11, a storage unit 5 and a read-only memory (ROM) 10. The micro-computer 11 includes a communication terminal 9.

The voltage detection circuit 4, detects the voltage of the battery E in order to calculate the capacity of the battery E based on the correlation between the voltage of the battery E and the capacity. The battery E is made up of four battery cells 41a, 41b, 41c, 41d and, for measuring the voltages of these battery cells 41a, 41b, 41c, 41d, a multiplexer 42 and an operational amplifier 43 are provided in the voltage detection circuit 4. By battery cell selection control signals being fed from the micro-computer 11 in the controller 1 to the multiplexer 42, the four battery cells 41a, 41b, 41c, 41d are sequentially selected by multiplexer 42, which then sends the terminal voltages of the four batteries to an operational amplifier 43. The voltage detection signals from the operational amplifier 43 are sent to the controller 1 and analog-to-digital (A/D) converted in the controller 1 so that the battery cell terminal voltage is retrieved as digital values by the micro-computer 11.

The current detection circuit 3, detects the current magnitude of the battery E in order to integrate the current magnitude of the battery E with respect to time to calculate the capacity of the battery E. This current detection circuit 3 includes a resistor 44 for current measurement which is connected to, for example, the minus side of the battery E and an operational amplifier 45 for detecting the voltage corresponding to the current flowing in the resistor 44. The current detection signal from the operational amplifier 45 is sent to the controller 1 where it is analog-to-digital (A/D) converted so that the measured current value is retrieved as a digital value in the micro-computer 11.

To the multiplexer 42 and the operational amplifiers 43, 45, power is fed from the plus side of the battery cell set via a power saving switch 46. This switch 46 is tuned on/off by the power save signals supplied from the micro-computer 11. A control switch 2 for controlling the charging/discharging on/off is connected across the +terminal 7 of the battery pack 20 (plus battery terminal) and the plus side of the battery E. This control switch 2 includes a series connection of an FET 21, as a charging switching element, and an FET 33, as a discharging switching element. A pair of diodes 33, 34 are connected in parallel with these FETs 21, 22. The FET 21 for charging is on/off controlled by the driver 25 driven by the control signals supplied from the micro-computer 11. The FET 22 for discharging is on/off controlled by the driver 26, which is driven by control signals supplied from the micro-computer 11 of the controller 1.

Figure 2:
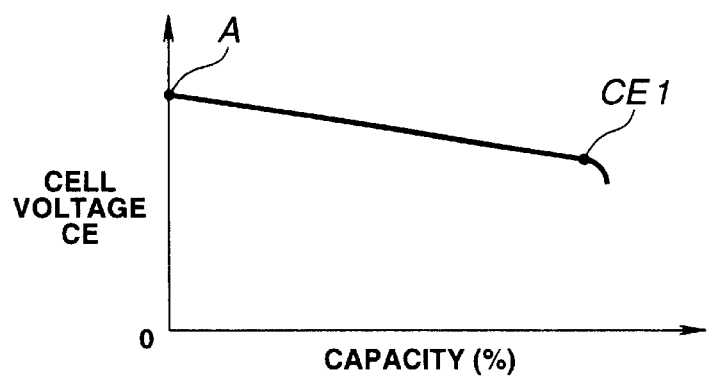
FIG. 2 shows a typical relation between the cell voltage of the battery and the capacity (%) in the voltage method.

The controller 1, having the micro-computer 11, is configured to switch between the operation of calculating the capacity of the battery E, based on the relation between the voltage and the capacity of the battery E, using a prescribed current magnitude or a pre-set voltage drop value as a threshold or switching point, and the operation of integrating the current magnitude of the battery E with respect to time to calculate the capacity of the battery E. The relation between the cell voltage detected by the voltage detection circuit 4 and the capacity (%) of the battery E is shown in FIG. 2, in which the cell voltage CE is plotted on the ordinate and the current capacity to full capacity ratio, expressed in % (capacity %) is plotted on the abscissa. The point A in FIG. 2 denotes the time point of start of discharge. The cell voltage CE is decreased substantially linearly, while the capacity % of the battery E is also decreased substantially linearly. There exists a voltage value CE1 at which the cell voltage is decreased abruptly.

The controller 1, in particular the micro-computer 11, calculates the capacity % based on a voltage detection value DE of the cell voltage CE obtained by the voltage detection circuit 4 based in turn on the relation between the cell voltage CE and the capacity % of FIG. 2.

The battery pack 20 monitors the state of the battery E, such as its voltage, charging/discharging current or residual capacity, to exchange data with a charger, not shown, or a load, such as the personal computer 30, by way of having the communication. To this end, the battery pack 20 has, enclosed therein, the controller 1 having a cell monitoring and controlling micro-computer 11. It is possible with this battery pack 20 to display the states of the battery E, sent thereto from the micro-computer 11 over the communication terminal 9, on a display provided on the load or on the charger, to advise the user of such states.

The battery E, enclosed in the battery pack 20, includes a set of four lithium-ion-based battery cells 41a, 41b, 41d and 41d, such a battery E could be a Nicd battery as well. The +terminal of the battery E is connected via the switch 2 to a +terminal 7 of the pack (package of the battery pack 20), while its –terminal is connected via current detection circuit 3 to a –terminal 8 (GND terminal). The battery pack 20 is loaded in a battery housing section, not shown, provided in the personal computer 30, whereby the +terminal 7 of the pack side is electrically connected to the +terminal 12 of the personal computer 30 and the –terminal 8 on the pack side is electrically connected to the –terminal 13 of the personal computer 30. When the battery pack 20 is charged, the charging current also flows through the +terminal 7 and the –terminal 8.

The micro-computer 11 of the controller 1 is, for example, a central processing unit (CPU), and is configured for periodically receiving the output of the current detection circuit 3 or the voltage detection circuit 4 to recognize the current flowing through the battery E (charging current and discharging current) or the voltage of the battery E. The micro-computer 11 controls the normally-on control switch 2, based on the voltage or current, to turn off the control switch 2 to interrupt the current (charging current and discharging current) to prohibit overcharging, over discharging or excess current.

The micro-computer 11 finds the current residual capacity of the battery E, based on the voltage of the battery E recognized as described above. The micro-computer 11 also finds the integrated capacity for the charging capacity, based on the current capacity found as described above.

The micro-computer 11 is connected to the communication terminal 9 of the pack. This communication terminal 9 is electrically connected to a communication terminal 14 of the personal computer 30 when the battery pack 20 is loaded on the personal computer 30. The communication terminal 14 of the personal computer 30 is connected to the communication LSI 39 so that, when the battery pack 20 is loaded on the personal computer 30, communication occurs between the micro-computer 11 of the battery pack 20 and the communication LSI 39 of the personal computer 30, via communication terminals 9, 14, in accordance with a pre-set communication sequence.

Specifically, the controller 1, in particular the micro-computer 11, performs preset processing responsive to the data (commands etc) sent thereto from the communication terminal 14 of the personal computer 30, or transmits the cell voltage, charging/discharging current, residual capacity of the battery E or the integrated capacity, to the communication terminal 14 of the personal computer 30 via communication terminal 9. The battery E is for example, a lithium ion cell. The voltage of the battery E, termed an open voltage or a cell voltage, is related with the residual capacity in a manner as shown in FIG. 2 such that, if the cell voltage is found, the residual capacity, expressed in terms of % relative to the full capacity, can be found. Thus, the micro-computer 11 finds the residual capacity of the battery B, such as the lithium-ion-cell, based on the cell voltage, as described above.

The control switch 2 shown in FIG. 1 operates under control of the micro-computer 11 to turn the charging/discharging current on or off. The current detection circuit 3 detects the current flowing therein, that is the discharging current of the battery E, as well as the charging current to the battery E, to send the detected results to the micro-computer 11. The storage unit 5 includes a register for storage of the integrated capacity. A display unit 6 is for example, a liquid crystal display which displays the information such as the integrated capacity under control by the micro-computer 11.

In the ROM (read-only memory) 11 are stored programs or data necessary for the operation of the micro-computer 11. That is, the micro-computer 11 refers to the data stored in the ROM 10 as the occasion may demand to execute the programs stored in the ROM 10 to perform a variety of operations.

When the parallel flat plate 20 is loaded in normal fashion on the personal computer 30, the +terminal 7, −terminal 8 and the communication terminal 9 are electrically connected to the terminals 12 to 14 of the personal computer 30, respectively. The personal computer 30 operates with the battery pack 20 as the picture signals, with the discharge current of the battery E flowing through the +terminals 7, 12, personal computer 30 and through the −terminals 13, 8.

In the battery pack 20, the current detection circuit 3 or the voltage detection circuit 4 detects the current (charging or discharging current) flowing in the battery E, or the cell voltage, respectively. These current and voltage values are periodically received in the micro-computer 11. The micro-computer 11 verifies, on the basis of these current or voltage values, whether or not the battery E is in the overcharged or over discharged state or in the overcurrent state. If the battery E is in the overcharged or over discharged state, the control switch 2 is turned off to break the current (charging or discharging current).

The micro-computer 11 calculates the current capacity (residual capacity of the battery E), based on the cell voltage of the battery E, and further calculates the integrated capacity, as reference is had to a register unit 5, based on the calculated current capacity. The micro-computer 11 transmits the integrated capacity, calculated as described above, the current value supplied from the current detection circuit 3, and the voltage value supplied from the voltage detection circuit 4, via the communication terminal 9, responsive to the request from the personal computer 30. The micro-computer 11 also sends the calculated integrated capacity to the display unit 6 for display thereon.

A preferred typical example of the current integrating method is explained with reference to FIGS. 3 and 4. In the current integrating method, in which the flowing current is integrated to find Ah (ampere/hour), the current magnitude needs to be measured accurately. For example, if the maximum current for measurement is 10 A and the minimum measurable current is 1 mA, the magnitude which represents 10 A, referred to 1 mA as the minimum unit, is 10000, such that, for representing 10000 decimal, 14 bits ($2^{14}$=16384) are required. Therefore, for representing data of measured values in the central processing unit (CPU) of the micro-computer 11 of FIG. 1, 14 bits are theoretically required. That is, a 14-bit analog-to-digital (A/D) converter is required.

If, in integrating the 14-bit data, the integration spacing is decreased excessively, the memory capacity required for integration is increased. Thus, the minimum integration resolution is set to find a practical integration spacing.

If, for example, 1 mA is set as the resolution (minimum integration resolution), since the maximum current is 10 A, the minimum integration spacing is $$1[mAh]/10[A]=3600[mAsec]/10000[mA]=0.36[sec]$$

or 0.36 sec.

If the capacity of the battery is 4800 mAh, since 13 bits binary ($2^{13}$=8192) are required for representing 4800 decimal, the number of bits required for representing the integrated data value is 14 bits+13 bits=27 bits, which may be said to be a practical level of the required memory capacity.

Figure 3:
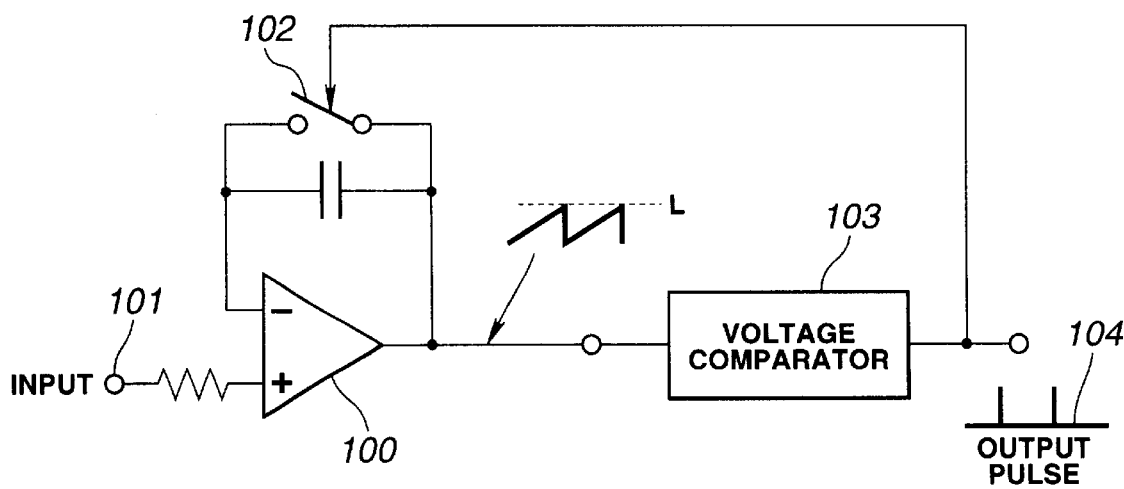
FIG. 3 shows an example of the current integration method.

As another example of converting the analog current magnitude for measuring the integrated current value in the current integrating method, there is such a method which uses an analog integrator 100 in combination, as shown in an illustrative circuit in FIG. 3. This circuit, gives an example of an integrator for carrying out the current integrating method and the concept of integration. It is noted that the circuit of FIG. 3 stands for one of the charging direction or the discharging direction. Two of the circuits shown in FIG. 3 are required for doing both charging and discharging.

The analog integrator 100 has an input terminal 101 and a reset switch 102. An output of the analog integrator 100 is connected to a voltage comparator 103. An output pulse of the voltage comparator 103 to be integrated is 1 mAh and is used for actuating a reset switch 102.

Figure 4:
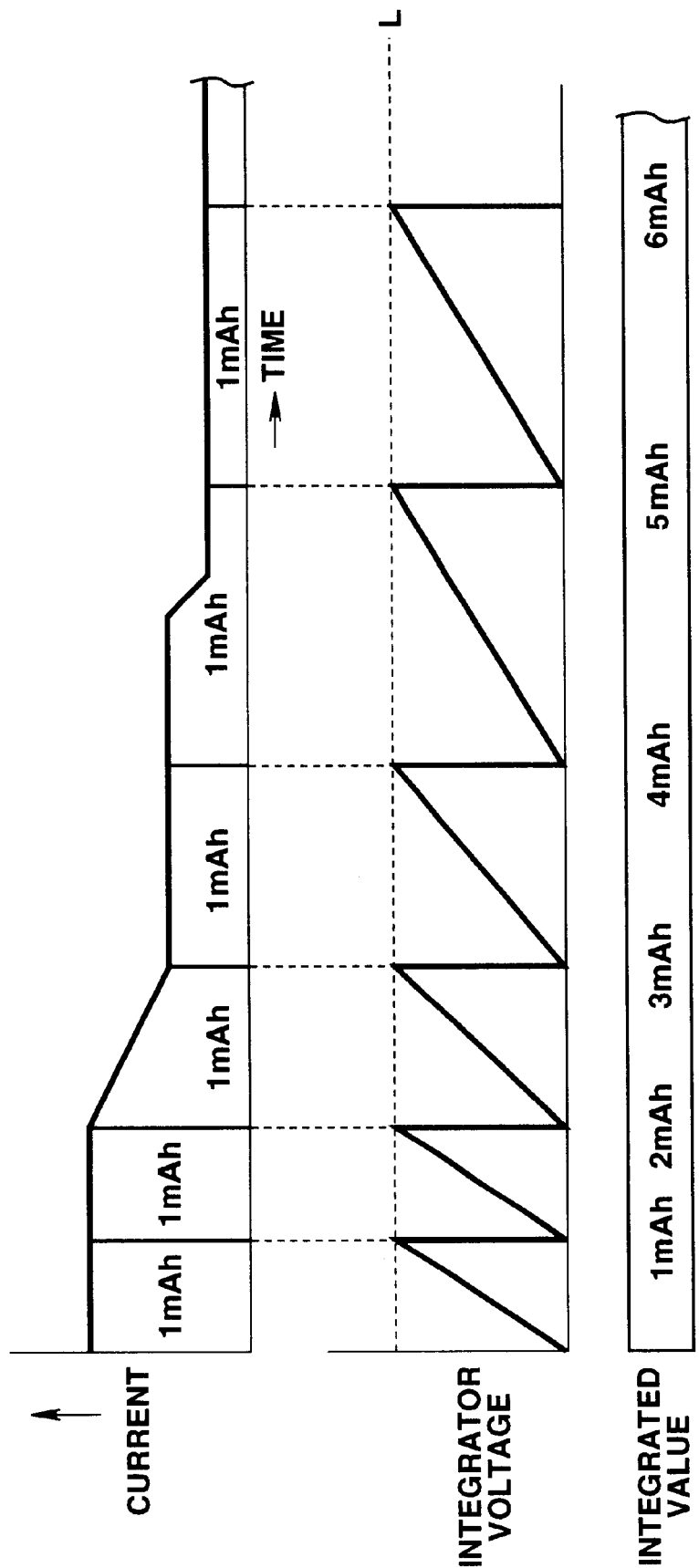
FIG. 4 shows illustrative detection of the current capacity in the current integration method shown in FIG. 3.

In the present example of the current integrating method, an output pulse 104 shown in FIG. 3 is outputted each time the analog integrator 100 overflows that is, each time the output reaches the level L and output pulses 104 are integrated, as shown in FIG. 4. That is, the time when the analog integrator 100 overflows, or the time when the output of the analog integrator 100 reaches the level L, is equivalent to the time point 1 mAh is measured. Thus, the current magnitude in mAh can be obtained by integrating the pulses from the voltage comparator.

Since the integration is a continuous operation, it is unnecessary to take the resolution into account. However, it is necessary to take account of the offset or drift proper to the analog integrator 100 which tends to deteriorate calculation accuracy.

Meanwhile, the aforementioned accuracy of the order of 14 bits is realized in certain ones of the currently marketed A/D converters. The aforementioned use of the 14-bit A/D converter is for theoretical considerations only and the precision realized in practical application is not so high as is contemplated in the present example. If current measurement is achieved to this order of accuracy, the current of the battery below 1 mA cannot be accommodated. There are occasions wherein no battery is used or the current cannot be measured based on the self-discharging of the battery. This point is taken into consideration in the present embodiment by using the voltage method in the small current range in place of the current integrating method so that the aforementioned high accuracy is not required. For example. A 10-bit A/D converter suffices for practical application.

Figure 5:
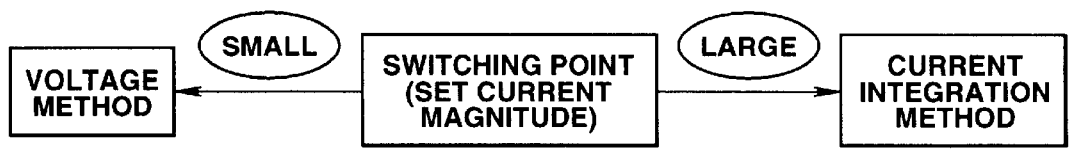
FIG. 5 shows an example of setting a current magnitude as a switching point.
Figure 6:
FIG. 6 shows an example of setting voltage drop magnitude as a switching point.

Referring to FIGS. 5 and 6, an instance of switching between the voltage method and the current integrating method based on a pre-set switching point is explained. In the present embodiment, the current integrating method and the voltage method are used for the larger and smaller magnitudes of the battery E for highly accurate calculation of the capacity of the battery E, respectively. This enables the calculation accuracy of the battery E to be improved even if the precision of the device used in the voltage detection circuit 4 for the voltage method or in the current detection circuit 3 for the current integrating method is not that high.

First, the system of setting a predetermined current value as a threshold value as the switching point (see FIG. 5) is explained. In this case, the threshold value as the switching point is set by the current value itself. Since the current value (threshold value) is fixed, the current measurement accuracy (error) of the current integrating method can be calculated easily. For example, the internal resistance of the battery E is increased with lowering in temperature such that, at −10° C., the internal resistance is occasionally several times that at ambient temperature. If, for example, the internal resistance is increased by a factor of four, is 250 mΩ at ambient temperature and 400 mA is set as the current magnitude corresponding to the switching point, the voltage drop of the battery E, which is 0.1V at ambient temperature, is as low as 0.4V at lower temperatures. If the accuracy for the voltage drop of 0.1V is good and that for the voltage drop of 0.4V is stringent, the current magnitude corresponding to the switching point needs to be set to a lower current magnitude, such as 100 mA. This renders the current measurement accuracy more stringent.

In the present method, if the current magnitude of the battery E exceeds a predetermined current magnitude, as set as the switching point (threshold value), the capacity integration of the capacity of the battery E is switched to the current integrating method. Conversely, if the current magnitude of the battery E is lower than the predetermined current magnitude (threshold value) as the switching point, the capacity integration of the capacity of the battery E is switched to the voltage method.

Next, the case of setting a predetermined voltage drop value of the battery E as the threshold value as this switching point (see FIG. 6) is explained. If the predetermined voltage drop value of the battery E is set as the threshold value as this switching point, the precision condition for the voltage method is easy to set, because the magnitude of the voltage drop (threshold value) is constant. If, for example, the magnitude of the voltage drop as the switching point is set to 0.1V, the current is 400 mA and 100 mA at ambient temperature and at lower temperature, respectively.

If the magnitude of the voltage drop of the battery E is larger than the threshold value as the switching point (with the predetermined magnitude of the voltage drop being, for example, 0.1V), more current is flowing, so that the current integrating method is used for detecting the capacity of the battery E. If the magnitude of the voltage drop of the battery E is smaller than the predetermined magnitude of the voltage drop of the switching point (threshold value), the voltage method is used as the method for detecting the capacity of the battery E.

The above-mentioned current magnitude or the magnitude of the voltage drop as the switching point is given merely as illustration. It is, however, possible to switch between the current integrating method and the voltage method only gradually or stepwise instead of completely switching between the current integrating method and the voltage method. It suffices then to provide a width to each of the preset current magnitude or magnitude of the voltage drop for switching and to switch gradually between cell capacity detection by the current integrating method for the larger current magnitude of the battery and that by the voltage method for the smaller current magnitude. Alternatively, plural threshold values are provided as the preset current magnitude or the magnitude of the voltage drop to switch between cell voltage detection by the voltage method and that by the current integrating method stepwise responsive to plural threshold values.

If, due to abrupt changes in the current magnitude or switching at a sole threshold value, switching between the current integrating method and the voltage method has occurred at one time, it is desirable to make processing for gradually changing the integrated capacity value. If the accuracy error is zero in the voltage method or in the current integrating method, this processing is not required. Since there exists a slight difference between the two systems, this processing is to be performed.

In the current integrating method, the cell capacity is calculated based on the integrated magnitude of the current that has flowed (in Ah or coulombs). In the voltage method, the cell capacity is determined by a pre-formulated table showing the cell voltage potted against the capacity (%) (see FIG. 2). In the current integrating method, the current magnitude obtained is subtracted from the full charged capacity of the battery E to find the residual capacity, conversely, in the voltage method, the current magnitude obtained is multiplied with the full charged capacity of the battery E to find the residual capacity. Thus, calculation errors, conversion errors or table errors represent influencing factors. Meanwhile, integration in the current integrating method is by integration with the capacity value obtained with the voltage method as the base point.

That is, when switching from the voltage method to the current integrating method, the ultimate cell capacity is found by integrating the current magnitude calculated by the current integrating method to the current cell capacity corresponding to the current cell capacity (cell capacity at the switching point), as found by the voltage method, as the base point. Conversely, in switching from the current integrating method to the voltage method, there are occasions when an error is produced between the current cell capacity (at the switching point) as found by current integration and the cell capacity directly after switching as found on the basis of the correlation between the voltage and the cell capacity. It is therefore desirable to take the error between the cell capacities into account to switch gradually from the cell capacity value as detected by the current integrating method directly before switching to the cell capacity value as detected by the voltage method directly after the switching.

It is also possible to estimate the full charging capacity or deterioration from the coulomb values between pre-set voltages or to construct the table of the voltage method from the highly accurate information of the current magnitude obtained by the current integrating method in case the current magnitude is constant and large such as during charging. The voltage method exploits the voltage-current characteristics of the lithium ion secondary battery to estimate the capacity % from the voltage of the cell terminals, as described above. If the magnitude of the voltage drop is significant, such as when the current is large, the voltage method is low in capacity measurement accuracy of the battery E because of overlap of various errors. Conversely, with the current integrating method, the integration error is large if the current is small, whereas, if the voltage fluctuations are large, the capacity accuracy is low.

With the cell capacity detection method according to the present invention, it is possible to obviate the deficiencies of the voltage method and the current integrating method reciprocally to detect the capacity of the battery E highly accurately by switching between these two methods at a preset switching point. The switching point may be the current magnitude or the magnitude of the voltage drop, as described above.

The present invention also may be applied to the cell pack (battery pack) to which the above-described cell capacity detection method is applied, and to an electronic equipment system which includes the cell pack and the electronic equipment for loading the cell pack.

With the above-described battery capacity detection method, battery pack and the electronic equipment system, of the present invention, the calculation accuracy of the capacity of the battery (residual capacity) can be increased by selectively using the voltage method and current integrating method depending on the current magnitude in the battery.

Although the present invention has been described with reference to specific embodiments, those of skill in the art will recognize that changes may be made thereto without departing from the spirit and scope of the invention as set forth in the hereafter appended claims.

What is claimed is:

1. A method for detecting battery capacity of a battery, comprising the steps of:

detecting the battery capacity by a voltage method, the voltage method including measuring a voltage of the battery and calculating the battery capacity based on a correlation between the voltage and the battery capacity;

detecting the battery capacity by a current integrating method, the current integrating method including integrating a current magnitude of the battery with respect to time to calculate the battery capacity; and switching between the voltage method and the current integrating method based on a pre-set current magnitude to detect the battery capacity.

2. A method for detecting battery capacity of a battery as claimed in claim 1, further comprising the steps of:

setting a threshold value as the pre-set current magnitude;

detecting if the current magnitude of the battery is larger than the threshold value;

detecting the battery capacity by the current integrating method if the current magnitude of the battery is larger than the threshold value; and detecting the battery capacity by the voltage method if the current magnitude of the battery is not larger than the threshold value.

3. A method for detecting battery capacity of a battery as claimed in claim 1, further comprising the step of:

according a certain width to the pre-set current magnitude to effect a gradual switching between the current integrating method for large current in the battery and the voltage method for small current in the battery.

4. A method for detecting battery capacity of a battery as claimed in claim 1, further comprising the step of:

setting a plurality of threshold values as the pre-set current magnitude to effect stepwise switching between the current integrating method for large current in the battery and the voltage method for small current in the battery.

5. A method for detecting battery capacity of a battery as claimed in claim 1, wherein, in switching from the voltage method to the current integrating method, the battery capacity is found by integrating the current magnitude as detected by the current integrating method with the battery capacity as detected by the voltage method as a base point.

6. A method for detecting battery capacity of a battery as claimed in claim 1, wherein, in switching from the current integrating method to the voltage method, an ultimate battery capacity is found by gradually switching between the battery capacity as found by the current integrating method and the battery capacity as found by the voltage method.

7. A method for detecting battery capacity of a battery, comprising the steps of:

detecting the battery capacity by a voltage method, the voltage method including measuring a voltage of the battery and calculating the battery capacity based on a correlation between the voltage and the battery capacity;

detecting the battery capacity by a current integrating method, the current integrating method including integrating a current magnitude of the battery with respect to time to calculate the battery capacity; and switching between the voltage method and the current integrating method based on a pre-set voltage drop of the battery to detect the battery capacity.

8. A method for detecting battery capacity of a battery, as claimed in claim 7, further comprising the steps of:

setting a threshold value as the pre-set voltage drop;

detecting if the current magnitude of the battery is larger than the threshold value;

detecting the battery capacity by the current integrating method if the current magnitude of the battery is larger than the threshold value; and detecting the battery capacity by the voltage method if the current magnitude of the battery is not larger than the threshold value.

9. A method for detecting battery capacity of a battery as claimed in claim 7, further comprising the step of:

according a certain width to the pre-set voltage drop to effect gradual switching between the current integrating method for a large voltage drop in the battery and the voltage method for a small voltage drop in the battery.

10. A method for detecting battery capacity of a battery, as claimed in claim 7 further comprising the step of:

setting a plurality of threshold values as the pre-set voltage drop to effect stepwise switching between the current integrating method for a large voltage drop in the battery and the voltage method for a small voltage drop in the battery.

11. A method for detecting battery capacity of a battery as claimed in claim 7, wherein, in switching from the voltage method to the current integrating method, the battery capacity is found by integrating the current magnitude as detected by the current integrating method with the battery capacity as detected by the voltage method as a base point.

12. A method for detecting battery capacity of a battery as claimed in claim 7, wherein, in switching from the current integrating method to the voltage method, an ultimate battery capacity is found by gradually switching between the battery capacity as found by the current integrating method and the battery capacity as found by the voltage method.

13. A battery pack for detecting battery capacity of a battery, comprising:

voltage detection means for detecting a voltage of the battery to calculate the battery capacity based on a correlation between the voltage and the battery capacity;

current detection means for detecting a current magnitude of the battery to calculate the battery capacity by integrating the current magnitude of the battery with respect to time; and control means for switching between calculating the battery capacity based on the correlation between the voltage and the battery capacity responsive to a pre-set current magnitude, and calculating the battery capacity by integrating the current magnitude of the battery with respect to time.

14. A battery pack as claimed in claim 13, wherein a threshold value is set as the pre-set current magnitude, and wherein the battery capacity is calculated by integrating the current magnitude of the battery with respect to time if the current magnitude is larger than the threshold value, and wherein the battery capacity is calculated based on the correlation between the voltage and the battery capacity if the current magnitude is smaller than the threshold value.

15. A battery pack as claimed in claim 13, wherein a certain width is accorded to the pre-set current magnitude to effect gradual switching between the current magnitude integration in case of a large current in the battery and the correlation between the voltage and the battery capacity for a smaller current in the battery.

16. A battery pack as claimed in claim 13, wherein a plurality of threshold values are set as the pre-set current magnitude to effect stepwise switching between the current magnitude integration for a large current in the battery and the correlation between the voltage and the battery capacity for a small current in the battery.

17. A battery pack as claimed in claim 13, wherein, in switching from the correlation between the voltage and the battery capacity to the current magnitude integration, the battery capacity is found by integrating the current magnitude as detected by the current magnitude integration with the battery capacity as detected based on the correlation between the voltage and the battery capacity as a base point.

18. A battery pack as claimed in claim 13, wherein, in switching from the current magnitude integration to the correlation between the voltage and the battery capacity, an ultimate battery capacity is found by gradual transition from the current magnitude integration to the correlation between the voltage and the battery capacity.

19. A battery pack for detecting battery capacity of a battery, comprising:

voltage detection means for detecting a voltage of the battery to calculate the battery capacity based on a correlation between the voltage and the battery capacity;

current detection means for detecting a current magnitude of the battery to calculate the battery capacity by integrating the current magnitude of the battery with respect to time; and control means for switching between calculating the battery capacity based on the correlation between the voltage and the battery capacity responsive to a pre-set voltage drop of the battery, and calculating the battery capacity by integrating the current magnitude of the battery with respect to time.

20. A battery pack as claimed in claim 19, wherein a threshold value is set as the pre-set voltage drop, and wherein the battery capacity is calculated by integrating the current magnitude of the battery with respect to time if the voltage drop is smaller than the threshold value, and wherein the battery capacity is calculated based on the correlation between the voltage and the battery capacity if the voltage drop is larger than the threshold value.

21. A battery pack as claimed in claim 19, wherein, a certain width is accorded to the pre-set voltage drop to effect gradual switching between the current magnitude integration in case of a large voltage drop of the battery and the correlation between the voltage and the battery capacity for a smaller voltage drop in the battery.

22. A battery pack as claimed in claim 19, wherein a plurality of threshold values are set as the pre-set voltage drop to effect stepwise switching between the current magnitude integration for a large voltage drop in the battery and the correlation between the voltage and the battery capacity for a small voltage drop in the battery.

23. A battery pack as claimed in claim 19, wherein, in switching from the correlation between the voltage and the battery capacity to the current magnitude integration, the battery capacity is found by integrating the current magnitude as detected by the current magnitude integration with the battery capacity as detected based on the correlation between the voltage and the battery capacity as a base point.

24. A battery pack as claimed in claim 19, wherein, in switching from the current magnitude integration to the correlation between the voltage and the battery capacity, an ultimate battery capacity is found by gradual transition from the current magnitude integration to the correlation between the voltage and the battery capacity.

25. An electronic equipment system, comprising:

a battery pack for detecting battery capacity of a battery;

an electronic piece of equipment for removably mounting the battery pack via an electrically connecting portion wherein the electronic piece of equipment is fed with power from the battery pack;

voltage detection means in the battery pack for detecting a voltage of the battery to calculate the battery capacity of the battery based on a correlation between the voltage and the battery capacity;

current detection means in the battery pack for detecting a current magnitude of the battery to calculate the battery capacity of the battery by integrating the current magnitude with respect to time; and control means in the battery pack for switching, in response to a pre-set current magnitude, between the operation of calculating the battery capacity of the battery based on the correlation between the voltage and the battery capacity and the operation of integrating the current magnitude of the battery with respect to time to calculate the battery capacity of the battery.

26. An electronic equipment system as claimed in claim 25, wherein a threshold value is set as the pre-set current magnitude, and wherein the battery capacity is calculated by integrating the current magnitude of the battery with respect to time if the current magnitude is larger than the threshold value, and wherein the battery capacity is calculated based on the correlation between the voltage and the battery capacity if the current magnitude is smaller than the threshold value.

27. An electronic equipment system, comprising:

a battery pack for detecting battery capacity of a battery;

an electronic piece of equipment for removably mounting the battery pack via an electrically connecting portion wherein the electronic piece of equipment is fed with power from the battery pack;

voltage detection means in the battery pack for detecting a voltage of the battery to calculate the battery capacity of the battery based on a correlation between the voltage and the battery capacity;

current detection means in the battery pack for detecting a current magnitude of the battery to calculate the battery capacity of the battery by integrating the current magnitude with respect to time; and control means in the battery pack for switching, in response to a pre-set voltage drop of the battery, between the operation of calculating the battery capacity of the battery based on the correlation between the voltage and the battery capacity and the operation of integrating the current magnitude of the battery with respect to time to calculate the battery capacity of the battery.

28. An electronic equipment system as claimed in claim 27, wherein a threshold value is set as the pre-set voltage drop, and wherein the battery capacity is calculated by integrating the voltage drop of the battery with respect to time if the current magnitude is smaller than the threshold value, and wherein the battery capacity is calculated based on the correlation between the voltage and the battery capacity if the voltage drop is larger than the threshold value.

* * * * *